United States Patent
Iwai et al.

(10) Patent No.: US 9,287,453 B2
(45) Date of Patent: Mar. 15, 2016

(54) COMPOSITE SUBSTRATES AND FUNCTIONAL DEVICE

(71) Applicant: NGK INSULATORS, LTD., Aichi-prefecture (JP)

(72) Inventors: Makoto Iwai, Kasugai (JP); Katsuhiro Imai, Nagoya (JP); Masahiro Sakai, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/852,947

(22) Filed: Sep. 14, 2015

(65) Prior Publication Data

US 2016/0005924 A1    Jan. 7, 2016

Related U.S. Application Data

(63) Continuation of application No. PCT/JP2014/083165, filed on Dec. 15, 2014.

(30) Foreign Application Priority Data

Dec. 18, 2013 (JP) .................................. 2013-261037

(51) Int. Cl.
| | |
|---|---|
| *H01L 23/48* | (2006.01) |
| *H01L 33/32* | (2010.01) |
| *H01L 33/00* | (2010.01) |
| *H01L 33/20* | (2010.01) |
| *H01L 21/02* | (2006.01) |

(52) U.S. Cl.
CPC .............. *H01L 33/32* (2013.01); *H01L 33/007* (2013.01); *H01L 33/20* (2013.01); *H01L 21/0245* (2013.01); *H01L 21/02458* (2013.01)

(58) Field of Classification Search
CPC ....... H01L 33/32; H01L 33/007; H01L 33/20; H01L 21/02458; H01L 21/0245
See application file for complete search history.

(56) References Cited

U.S. PATENT DOCUMENTS

| | | | |
|---|---|---|---|
| 7,935,550 B2 | 5/2011 | Dwilinski et al. | |
| 8,110,484 B1 * | 2/2012 | Sato ........................ | C30B 25/04 257/E21.113 |

(Continued)

FOREIGN PATENT DOCUMENTS

| | | |
|---|---|---|
| JP | 2005-506271 A | 3/2005 |
| JP | 2005-136167 A | 5/2005 |

(Continued)

OTHER PUBLICATIONS

International Search Report and Written Opinion for PCT Patent App. No. PCT/JP2014/083165 (Mar. 17, 2015) with English language translation of the Search Report and relevant portions of the Written Opinion thereof.

*Primary Examiner* — Nicholas Tobergte
(74) *Attorney, Agent, or Firm* — Cermak Nakajima & McGowan LLP; Tomoko Nakajima

(57) ABSTRACT

In the case that a functional layer, made of a nitride of a group 13 element, is formed on a composite substrate including a sapphire body and a gallium nitride crystal layer disposed over the sapphire body, the deviation of the function is prevented. The composite substrate 4 includes a sapphire body 1A and a gallium nitride crystal layer 3 disposed over the sapphire body. Aa warpage of the composite substrate is in a range of not less than +40 μm and not more than +80 μm per 5.08 cm in length.

7 Claims, 3 Drawing Sheets

(56) References Cited

U.S. PATENT DOCUMENTS

| | | | |
|---|---|---|---|
| 8,699,537 B2 * | 4/2014 | Sharma | B82Y 20/00 372/43.01 |
| 8,796,721 B2 | 8/2014 | Niki et al. | |
| 9,023,722 B2 * | 5/2015 | Evans | H01L 21/02381 438/506 |
| 9,041,004 B2 | 5/2015 | Iwai et al. | |
| 9,045,844 B2 | 6/2015 | Iwai et al. | |
| 2005/0093101 A1 | 5/2005 | Matsumoto | |
| 2006/0240574 A1 * | 10/2006 | Yoshie | H01L 21/67103 438/1 |
| 2007/0261633 A1 | 11/2007 | Tanaka | |
| 2009/0108297 A1 * | 4/2009 | Sato | B82Y 10/00 257/192 |
| 2013/0022773 A1 | 1/2013 | Aida et al. | |
| 2013/0149847 A1 | 6/2013 | Satoh et al. | |
| 2014/0158978 A1 | 6/2014 | Iwai et al. | |

FOREIGN PATENT DOCUMENTS

| | | |
|---|---|---|
| JP | 2006-054231 A | 2/2006 |
| JP | 2006-332714 A | 12/2006 |
| JP | 2009-111423 A | 5/2009 |
| JP | 4301251 B2 | 5/2009 |
| JP | 4380791 B2 | 10/2009 |
| JP | 2010-168236 A | 8/2010 |
| JP | 2010-219353 A | 9/2010 |
| WO | WO2011/129246 A1 | 10/2011 |
| WO | WO2013/021804 A1 | 2/2013 |
| WO | WO2013/022122 A1 | 2/2013 |
| WO | WO2013/022123 A1 | 2/2013 |
| WO | WO2013/051163 A1 | 4/2013 |

\* cited by examiner

COMPOSITE SUBSTRATES AND FUNCTIONAL DEVICE

TECHNICAL FIELD

The present invention relates to composite substrates and functional devices.

BACKGROUND ARTS

In recent years, it has been actively studied that semiconductor devices, including a blue LED, a white LED, a blue-violet semiconductor laser, etc., are fabricated by using a nitride of a group 13 element, such as gallium nitride, and that those semiconductor devices are applied to various types of electronic devices. Conventional gallium nitride-based semiconductor devices are produced mainly by a vapor phase method. Specifically, a gallium-nitride-based semiconductor device is produced by hetero-epitaxially growing a thin film of gallium nitride on a sapphire body or a silicon carbide substrate by a metal organic vapor phase epitaxy (MOVPE) and the like. In this case, the substrate and the thin film of gallium nitride differ greatly from each other in coefficient of thermal expansion and lattice constant, thus generating dislocations (as one kind of lattice defects in crystals) in gallium nitride at high density. Thus, it is difficult to obtain a high-quality gallium nitride with a low dislocation density by the vapor phase method.

A flux method is one of liquid phase methods. In the case of gallium nitride, metallic sodium is used as the flux, which can relieve conditions required for crystal growth of gallium nitride, namely, a temperature of approximately 800° C. and a pressure of several MPa. Specifically, nitrogen gas is dissolved in a mixed melt composed of metallic sodium and metallic gallium, and the gallium nitride is in an oversaturated state to grow as crystal. Such a liquid phase method is less likely to generate dislocations as compared to the vapor phase method, and thus can produce the high-quality gallium nitride with a low dislocation density.

The present applicant has filed the following applications as methods for producing a GaN template using a Na flux method: Patent document 1 (Japanese Unexamined Patent Application Publication No. 2010-168236A); Patent document 2 (WO 2013/022122A); Patent document 3 (WO 2013/021804A); and Patent document 4 (WO 2013/022123A).

Further, Patent document 5 (Japanese Unexamined Patent Application Publication No. 2005-136167A) discloses that, in order to correct warpage of a GaN self-supporting body, the front side and back side of the GaN self-supporting body are polished in turn.

PRIOR PATENT DOCUMENTS

Patent document 1: Japanese Unexamined Patent Application Publication No. 2010-168236A
Patent document 2: WO 2013/022122A
Patent document 3: WO 2013/021804A
Patent document 4: WO 2013/022123A
Patent document 5: Japanese Unexamined Patent Application Publication No. 2005-136167A
Patent document 6: Japanese Patent Publication No. 4301251A
Patent document 7: Japanese Unexamined Patent Application Publication No. 2010-219353A
Patent document 8: Japanese Patent Publication No. 4380791A
Patent document 9: Japanese Unexamined Patent Application Publication (Translation of PCT Application) No. 2005-506271A
Patent document 10: Japanese Unexamined Patent Application Publication No. 2009-111423A
Patent document 11: Japanese Unexamined Patent Application Publication No. 2006-332714A

SUMMARY OF THE INVENTION

The inventors have studied about formation of a structure for achieving functions of an LED or a power device by the MOCVD method using a low-dislocation GaN template produced by the flux method. The GaN template substrate means a substrate that includes a seed crystal layer and a gallium nitride crystal layer formed on a supporting body. The GaN template substrate serves as a template for further forming functional layers thereon.

Specifically, a seed crystal substrate is produced by depositing a gallium nitride crystal layer on a sapphire body with a flat surface by the MOCVD method or the like. Then, on the seed crystal substrate, a gallium nitride crystal layer is grown at a growth temperature of 800 to 900° C. by the flux method, which can produce a GaN template having the gallium nitride crystal layer with the uppermost surface having a low dislocation density. Further, to equalize functional devices deposited on the GaN template, the sapphire body of the GaN template is polished and processed to reduce the warpage of the GaN template.

The inventors have tried to produce an LED structure using this kind of GaN template by the MOCVD method. It is found, however, that the deposition of a light emitting element structure under a high temperature atmosphere (e.g. at a 1000° C. or higher) causes the unintended distribution of light emission wavelength, resulting in a small area ratio of a region that can create a desired light emission wavelength.

The inventors have examined the causes of the light emission wavelength distribution. As a result, unexpectedly, as the warpage of the GaN template at room temperature is reduced by polishing and processing the back face of the sapphire body, the light emission wavelength distribution becomes larger. This is because deviation in composition occurs in a light emission layer when depositing the light emission layer.

An object of the present invention is to suppress variations in quality of a functional layer made of a nitride of a group 13 element in forming the functional layer on a composite substrate, which includes a sapphire body and a gallium nitride crystal layer grown on the sapphire body.

The present invention provides a composite substrate comprising a sapphire body and a gallium nitride crystal layer disposed over the sapphire body. A warpage of the composite substrate is set in a range of not less than +40 µm and not more than +80 µm per 5.08 cm in length.

The present invention is also directed to a functional device, comprising the composite substrate and a functional layer formed of a nitride of a group 13 element over the gallium nitride crystal layer by a vapor phase method.

In the flux method, the gallium nitride crystal layer is grown at a growth temperature of 800° C. to 900° C. However, when the functional layer is formed over the composite substrate by the vapor phase method, such as an MOCVD method, the composite substrate has to be heated up to 1000° C. or more, causing warpage of the composite substrate to generate distribution of composition in the functional layer, resulting in variations in functions of the functional layer.

Based on these findings, the inventors have reached the idea of intentionally leaving the warpage of appropriate size in the composite substrate without eliminating the warpage at room temperature. With this arrangement, it is found out that when depositing a next functional layer, the composition distribution in the functional layer can be reduced to suppress variations in the functions thereof, which leads to achieving the present invention.

DESCRIPTION OF EMBODIMENTS

The present invention will be described in detail below with reference to the accompanying drawings as appropriate.

First, a description will be given of the composite substrate and problems associated therewith that have been studied by the inventors.

Figure 1A:
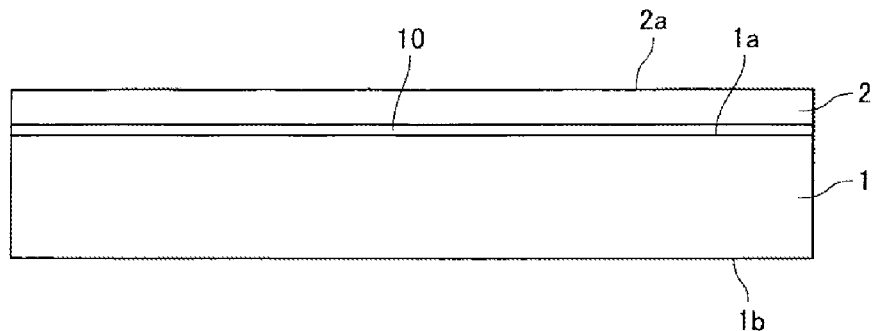
FIG. 1(a) is a view showing state of a gallium nitride crystal layer 2 formed on a sapphire body 1.
Figure 1B:
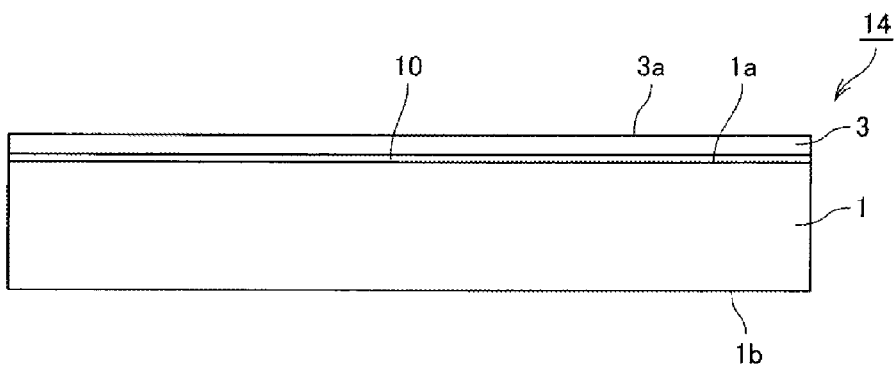
FIG. 1(b) is a view showing a gallium nitride crystal layer 3 obtained by polishing a surface 2a of the gallium nitride crystal layer 2 shown in FIG. 1(a)

Now, as shown in FIG. 1(a), a seed crystal layer 10 is formed on a main surface 1a of a sapphire body 1. Then, a gallium nitride crystal layer 2 is formed on the seed crystal layer 10 by the flux method. Thereafter, as shown in FIG. 1(b), a surface 2a of the gallium nitride crystal layer 2 is polished to produce a polished gallium nitride crystal layer 3. Reference numeral 3a denotes a polished surface.

Figure 3A:
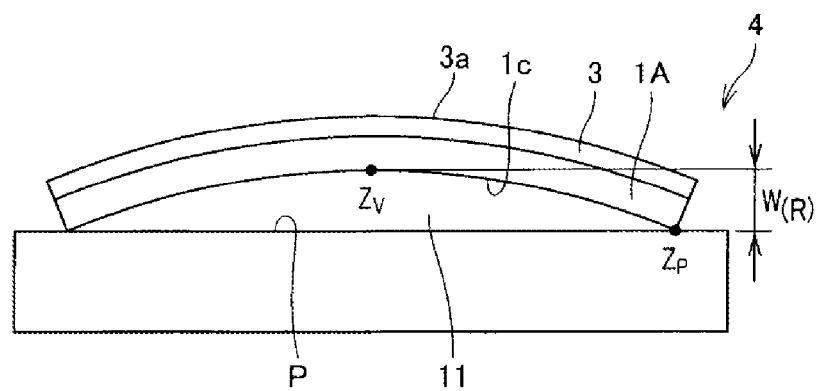
FIG. 3(a) is a schematic diagram for explaining a measurement method for a warpage of the composite substrate, showing the case of a positive warpage.

In a thus-obtained composite substrate 14, warpage occurs due to the deposition and cooling during the flux method. In general, as schematically shown in FIG. 3(a), the warpage exhibits a convex shape on the upper side with the sapphire body placed on the lower side. Such warpage is assumed to adversely affect the subsequent deposition on the composite substrate by the vapor phase method.

Figure 1C:
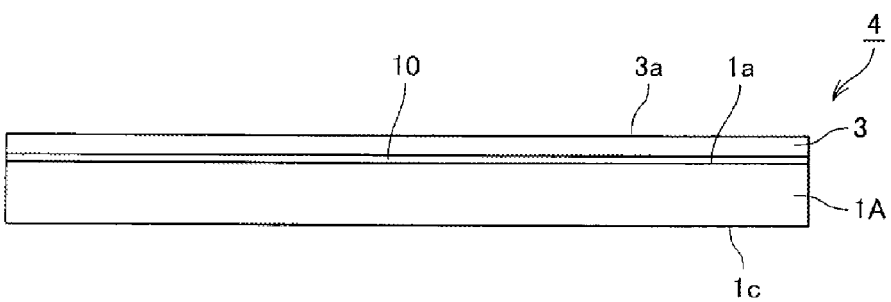
FIG. 1(c) is a view showing a composite substrate 4.

For this reason, the inventors have proposed that, as shown in FIG. 1(c), a bottom surface 1b of the sapphire body 1 is sufficiently polished to form a polished supporting body 1A. Reference numeral 1c denotes the polished bottom surface. In this way, a processing strain is introduced into the structure of the supporting body, succeeding in substantially eliminating the convex warpage in the form shown in FIG. 3(a).

The inventors have made an attempt to perform a deposition process by using the thus-obtained composite substrate with little warpage, thereby forming the light emitting element. This is because the way described above is supposed to provide the light emitting element of good quality according to the knowledge in the related arts.

However, actually, it has been found that the formation of the light emitting element expands a region in which the light emission intensity does not reach a predetermined value to thereby reduce the entire light emission efficiency, leading to large variations in light emission intensity.

Figure 3B:
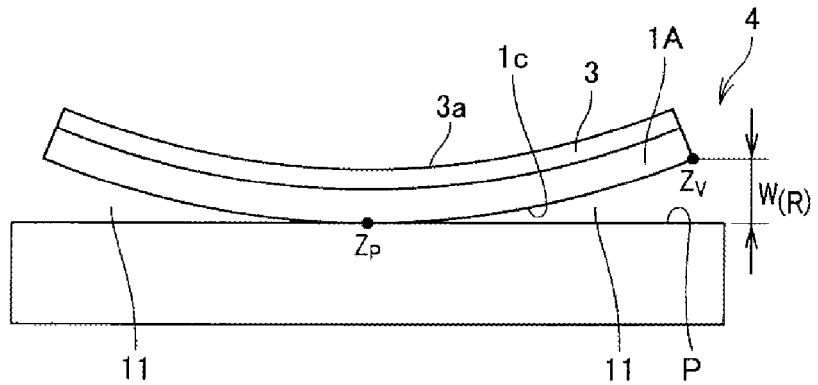
FIG. 3(b) is a schematic diagram for explaining the measurement method for the warpage of the composite substrate, showing the case of a negative warpage.

The inventors have studied the causes for this phenomenon, and as a result assumed that a thermal change applied during the deposition process causes concave warpage in the form shown in FIG. 3(b), leading to variations in composition of the film, which results in expanded distribution of the light emission intensity.

Based on this assumption, the inventors have realized that variations in deposition of a functional device can be suppressed by controlling the warpage of a composite substrate in the above-mentioned specific range before depositing the functional device. This is based on the idea that the warpage of the composite substrate is utilized to suppress the variations, which is clearly different from the related-art idea that any warpage should be reduced as much as possible.

In the invention, the composite substrate 4 is prepared to have its warpage restricted as mentioned above, and the functional layer is formed on the surface 3a of the substrate, thereby producing the functional device.

Figure 2A:
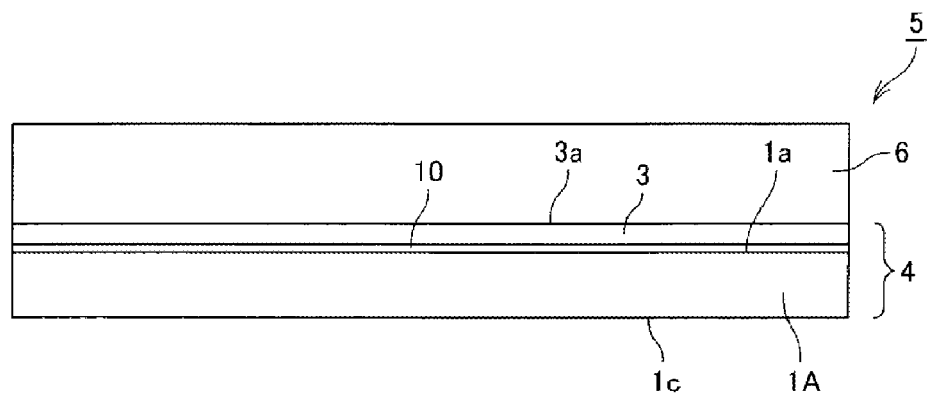
FIG. 2(a) is a view showing a functional device 5 formed by providing a functional layer 6 on the composite substrate 4.
Figure 2B:
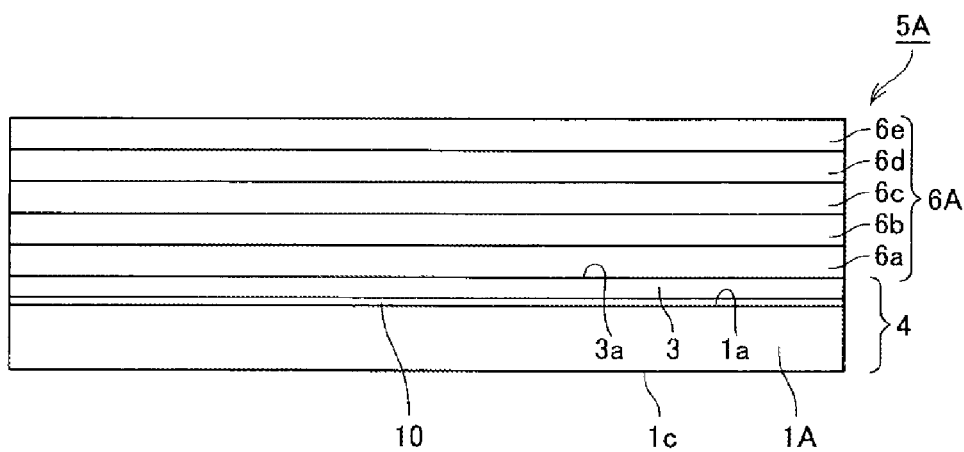
FIG. 2(b) is a view showing a functional device 5A formed by providing a functional layer 6A on the composite substrate 4.

That is, as shown in FIG. 2(a), a functional layer 6 is formed on the composite substrate 4 to produce a functional device 5. Here, the functional layer 6 can include a plurality of layers. For example, in an example shown in FIG. 2(b), a functional layer 6A is comprised of a plurality of layers 6a, 6b, 6c, 6d, and 6e to thereby form a light emitting element structure. Thus, the light emitting element structure with a small dislocation density is obtained to thereby improve the internal quantum efficiency of the light emitting element 5A.

The term "single crystal" as used in the present application includes, but not limited to, a single crystal in which atoms are regularly arranged across the entire crystal in terms of textbooks. That is, "single crystal" means one commonly used in term of general industry. That is, crystals may contain some defects, have internal strain, or trap impurities. Aside from a polycrystal (ceramics), these crystals may be called a single crystal with the same meaning as the term "single crystal".

(Sapphire Body)

The wurtzite structure of sapphire has the c-plane, the a-plane, and the m-plane. These respective crystal planes are defined crystallographically. The growth direction of an underlying layer, a seed crystal layer, and a gallium nitride crystal layer grown by the flux method may be a direction normal to the c-plane, or may also be a direction normal to each of the a-plane and the m-plane.

In view of the object of the invention, to prevent the gallium nitride crystal layer from being peeled off, the sapphire body is preferably thicker than the gallium nitride crystal layer. Thus, the thickness of the sapphire body is preferably in a range of 300 to 1600 μm, and more preferably in a range of 400 to 1300 μm.

(Seed Crystal Layer)

The seed crystal layer can be formed on the sapphire body.

The thickness of the seed crystal layer is not specifically limited, but preferably 0.01 μm or more, and more preferably 0.1 μm or more. If the thickness of the seed crystal layer is excessive, it will take a long time to perform a deposition process of the seed crystal layer, which is inefficient. Thus, the thickness of the seed crystal layer is desirably 3.0 μm or less, and more preferably 1.5 μm or less. Suitable materials for the seed crystal layer are preferably a nitride of a group 13 element to be described later.

The seed crystal layer may be composed of a single layer or a plurality of layers. Further, methods for forming the seed crystal layer may be vapor phase epitaxy method as a preferred example, and includes metal organic chemical vapor deposition (MOCVD) method, hydride vapor phase epitaxy (HYPE) method, pulse excited deposition (PXD) method, MBE method and sublimation method. The metal organic chemical vapor deposition method is particularly preferred.

The dislocation density of the seed crystal layer is preferably lower, from the viewpoint of reducing the dislocation density of the gallium nitride crystal layer formed over the seed crystal layer. In this aspect, the dislocation density of the seed crystal layer is preferably $7 \times 10^8$ cm$^{-2}$ or lower, and more preferably $5 \times 10^8$ cm$^{-2}$ or lower. Further, as the dislocation density of the seed crystal layer may preferably be lower in terms of quality, the lower limit of the dislocation density is not particularly defined, but may generally be $5 \times 10^7$ cm$^{-2}$ or higher in many cases.

The material for the seed crystal layer is preferably gallium nitride that can exhibit yellow luminescence effect by observing with a fluorescence microscope.

Gallium nitride that emits yellow light will be described below.

The gallium nitride crystal exhibits a broad peak in a range of 2.2 to 2.5 eV, in addition to exciton transition (UV) from one band to another. This is called the "yellow luminescence (YL)" or "yellow band (YB)".

The presence or absence of the yellow luminescence can be detected by exciting only the yellow luminescence in this range with the fluorescence microscope.

The yellow luminescence is generated due to radiation process associated with native defects inherent in crystals, such as nitrogen deficiency. Such defects act as luminescence centers. It is considered that impurities of transition elements, such as Ni, Co, Cr, and Ti, due to reaction environment are trapped in the gallium nitride, and act as yellow luminescence centers.

The gallium nitride crystal emitting yellow light is exemplified, for example, in Japanese Unexamined Patent Application Publication (Translation of PCT Application) No. 2005-506271A.

(Gallium Nitride Crystal Layer)

If the gallium nitride crystal layer is spontaneously peeled off the sapphire body, they cannot act as the composite substrate. Thus, from the viewpoint of suppressing peeling of the gallium nitride crystal layer, the thickness of the gallium nitride crystal layer (the thickness thereof immediately after the deposition) is preferably 100 µm or less, more preferably 50 µm or less, and most preferably 20 µm or less.

The thickness of the gallium nitride crystal layer (thickness thereof immediately after the deposition) is preferably 3 µm or more, and more preferably 10 µm or more, from the viewpoint of eliminating the dislocations in the seed crystal layer when growing the gallium nitride by the flux method to improve the crystallinity of the uppermost surface of the gallium nitride crystal layer.

Manufacturing methods of the gallium nitride crystal layer are not specifically limited, and includes metal organic chemical vapor deposition (MOCVD) method, hydride vapor phase epitaxy (HVPE) method, pulse excited deposition (PXD) method, MBE method, vapor phase method such as sublimation method, a liquid phase method, such as flux method, and the like.

When growing the gallium nitride crystal layer by the flux method, the kind of flux is not specifically limited as long as the flux can form the gallium nitride crystal. In a preferred embodiment, the flux containing at least one of an alkali metal and alkali earth metal is used, and more preferably the flux contains sodium metal.

In the flux, raw material for gallium is mixed and used. As the gallium raw materials, gallium single metal, a gallium alloy or a gallium compound may be used. In terms of handling, gallium single metal may be preferred.

The growth temperature of the gallium nitride crystal by the flux method, and the holding time during the crystal growth thereof are not specifically limited, and they are appropriately changed in accordance with a composition of the flux. As one example, when the gallium nitride crystal is grown using a flux containing sodium or lithium, the growth temperature may be preferably set at 800 to 950° C., and more preferably set at 850 to 900° C.

In the flux method, a single crystal is grown under an atmosphere of gas containing nitrogen atoms. This gas is preferably nitrogen gas, or alternatively may be ammonia. The total pressure of the atmosphere is not specifically limited, but it may be preferably set at 10 atm or more, and further preferably 30 atm or more, from the standpoint of prevention against the evaporation of the flux. However, under a high pressure, an apparatus will have to be larger. Therefore, the total pressure of the atmosphere may be preferably set at 2000 atm or less, and further preferably 500 atm or less. Gas in the atmosphere except for the gas containing nitrogen atoms is not limited; but an inert gas is preferably used, and especially, argon, helium or neon is more preferably used.

(Processing and Form of Composite Substrate)

In preferred embodiments, the composite substrate is disk-shaped, but may have any other shape, such as a rectangular board shape. In the preferred embodiments, the size of the composite substrate has a diameter ø50 mm or more. In this way, the composite substrate appropriate for mass-production of functional devices and easy to handle can be provided.

In the invention, a warpage of the composite substrate is set in a range of not less than +40 µM nor more than +80 µm per 5.08 cm length. The warpage is measured by the method disclosed in Japanese Unexamined Patent Application Publication No. 2009-111423A.

Specifically, referring to FIG. 3, the method of measuring the warpage will be described.

In an example shown in FIG. 3(a), a composite substrate is warped in such a manner that a bottom surface $1c$ of the sapphire body 1A of a specimen (composite substrate) 4 has a concave shape, while the gallium nitride crystal layer has a convex shape. This warpage is defined as the positive warpage (indicated by reference character +). On the other hand, in an example shown in FIG. 3(b), the composite substrate is warped in such a manner that the bottom surface $1c$ of the sapphire body 1A of the specimen (composite substrate) 4 has a convex shape, while the gallium nitride crystal layer has a concave shape. This warpage is defined as the negative warpage (indicated by reference character "−"). The curved surface formed by the bottom surface $1c$ of the composite substrate 4 is hereinafter referred to as a "warped and curved surface".

Suppose that a plane that minimizes an average distance between the warped and curved surface and a plane P is defined as the optimal plane P. Then, a distance between the warped and curved surface and the optimal plane P is measured. That is, zp is a point on the bottom surface $1c$ located on the optimal plane P within a region of the bottom surface having 2 inches (5.08 cm) in length. Further, zv is a point of the bottom surface $1c$ farthest from the optimal plane P. Accordingly, the warpage W(R) is defined as a distance between the point zv and the optimal plane P. Reference numeral 11 denotes a gap between the specimen and the plane P.

In other words, the warpage W(R) is a difference in height, on the bottom surface $1c$, between the point zp closest to the optimal plane P and another point zv farthest from the optimal plane P.

The above-mentioned effects of the invention can be exhibited by setting the warpage W(R) in a range of not less than +40 μm and not more than +80 μm. From this aspect, more preferably, the warpage W(R) is not less than +50 μm, and further preferably, not more than +70 μm.

The warpage of the composite substrate can be measured by a laser displacement gauge. The laser displacement gauge is a device that measures displacement of the bottom surface of the composite substrate by irradiating the bottom surface of the composite substrate with laser light. As the measurement system, a laser focus system or an optical interference system may be used depending on surface roughness with a wavelength of a laser set at 633 nm.

The process can be performed on the bottom of the supporting body in order to suppress the warpage of the composite substrate. Such process includes the following.

The term "grinding" is to trim a surface of an object by making solid abrasive grains rotate at a high rate in contact with the object; the solid abrasive grains being made up of abrasive grains fixed with a bond. Such grinding forms a rough surface. In grinding the bottom surface of the composite substrate, the solid abrasive grains are preferably used that contain abrasive grains having a high hardness, such as SiC, $Al_2O_3$, diamond, and CBN (cubic boron nitride, hereinafter, the same goes for the following description), and having a grain size of not less than approximately 10 μm nor more than approximately 100 μm.

The term "lapping" is to polish a surface of an object by making a surface plate and the object rotate in contact with each other via free abrasive grains (which are abrasive grains not fixed, the same goes for the following description), or by making the solid abrasive grains and the object rotate in contact with each other. Such lapping forms a surface having a smaller surface roughness than that in the case of grinding, and a larger roughness than that in the case of micro polishing. This polishing (lapping) preferably use abrasive grains having a high hardness, such as SiC, $Al_2O_3$, diamond, and CBN, the abrasive grain having a grain size of not less than approximately 0.5 μm nor more than approximately 15 μm.

In etching the bottom surface of the composite substrate, wet etching using an etchant is preferably performed. Suitable etchants includes a mixed solution of $NH_3$ and $H_2O_2$, a KOH solution, a NaOH solution, a HCl solution, a $H_2SO_4$ solution, a $H_3PO_4$ solution, a mixed solution of $H_3PO_4$ and $H_2SO_4$, etc. Here, water is preferably used as a solvent of the above-mentioned solutions and mixed solutions. The etchant can be appropriately diluted with a solvent, such as water, in use.

The term "micro polishing (polishing)" is to finely polish a surface of an object to planarize the surface, by making a polishing pad and the object rotate in contact with each other via free abrasive grains, or by making the solid abrasive grains and the object rotate in contact with each other. Such micropolishing forms a crystal growth surface having a smaller surface roughness than that in the normal lapping.

As the micro polishing method, mechanical polishing or chemical-mechanical polishing (hereinafter referred to as "CMP") is preferably used. The mechanical polishing and CMP are methods for finely polishing a surface of an object mechanically, or chemically and mechanically, by making a polishing pad and the object rotate in contact with each other via a slurry containing abrasive grains, respectively. The abrasive grain is a fine grain having an average grain size of not less than 0.1 μm nor more than 3 μm in order to reduce the surface roughnesses Ra and Ry. Specifically, as the abrasive grains, SiC, $Si_3N_4$, $Al_2O_3$, diamond, CBN, etc., which has a high hardness, and $SiO_2$, CuO, $TiO_2$, ZnO, NiO, $Cr_2O_3$, $Fe_2O_3$, CoO, MnO, etc., which has a low hardness, can be used alone or in combination. To enhance the chemical polishing effect, the slurry is preferably set to be acidic of pH≤5, or basic of pH 9. Alternatively, to the slurry, an oxidizing agent, such as hydrogen peroxide ($H_2O_2$), dichloroisocyanuric acid, nitric acid, potassium permanganate, copper chloride, etc., is preferably added to enhance an ORP (oxidation-reduction potential) (for example, ORP≥400 mV).

From the viewpoint of the invention, the thickness of the gallium nitride crystal layer (after the polishing) in the final composite substrate is preferably 100 μm or less, more preferably 50 μm or less, and most preferably 20 μm or less. Further, from the viewpoint of maintaining a certain level of crystal quality to improve the performance of the functional device, the thickness of the gallium nitride crystal layer (after the polishing) is preferably 5 μm or more.

In s preferred embodiment, the surface of the gallium nitride crystal layer is a mirror surface. The mirror surface is a glossy surface that is polished to have a high smoothness, with no substantially scattering of light by unevenness of the surface. The mirror surface made up of transparent material becomes a surface having high light permeability. Here, an average roughness (Ra) of the mirror surface shows a range of Ra=0.1 nm to 10 nm.

In a preferred embodiment, the bottom surface of the supporting body is a half-mirror surface. The half-mirror surface is a polished surface whose smoothness is appropriately adjusted, with some scattering of light due to the unevenness of the surface. The half-mirror surface made up of a transparent material becomes a surface that has slightly degraded light permeability as compared to that of the mirror surface and can be distinguished visually or by simple measurement.

Here, the half-mirror surface has an average roughness Ra of more than 10 nm and 500 nm or less. The surface having an average roughness Ra exceeding 500 nm is defined as a rough surface.

The Ra of the half-mirror surface in the invention is preferably not less than 100 nm and not more than 500 nm, and more preferably not less than 250 nm and not more than 500 nm.

A film made of a heat-resistant material may be formed on the bottom surface (bottom surface of the supporting body) of the composite substrate, thereby reducing the warpage of the composite substrate, which can fall within the scope of the invention. The heat-resistant material has enough heat resistance to stand the temperature in forming the functional device structure, such as the LED, on the composite substrate. Suitable material for forming such a film includes $SiO_2$ and $Ta_2O_5$. As a formation method for this kind of film, plasma CVD is preferable because it can form a film having high adhesion strength.

As the thickness of the heat-resistant film is increased, an absolute value of the warpage of the composite substrate generally tends to be decreased. Thus, the thickness of the heat-resistant film can be changed as appropriate in accordance with the size of warpage of the final composite substrate. Note that the thickness of the heat-resistant film is preferably 3 μm or more, and more preferably 5 μm or more, from the viewpoint of stability of the film on the bottom surface of the composite substrate. For the same reason, the thickness of the heat-resistant film is preferably 15 μm or less, and more preferably, 10 μm or less.

(Functional Layer and Functional Device)

A functional layer is formed on the thus-obtained composite substrate by the vapor phase method.

The functional layer may be composed of a single layer or a plurality of layers. Further, as the function, it may be used for a white LED with high brightness and color rendering properties, a blue-violet laser disk for high-speed and high-density optical memory, and a power device for an inverter for hybrid vehicles, and the like.

In the case that a semiconductor light emitting diode (LED) is produced on the composite substrate by the vapor phase method, preferably, a metal organic chemical vapor deposition (MOCVD) method, the dislocation density inside the LED becomes comparable with that of the composite substrate.

The film-forming temperature for the functional layer is preferably 950° C. or higher and more preferably 1000° C. or higher, from the viewpoint of the speed of the film formation. Further, from the viewpoint of preventing cracks, the film-forming temperature of the functional layer is preferably 1200° C. or lower and more preferably 1150° C. or lower.

A suitable material for the functional layer is a nitride of a group 13 element. The group 13 element means any group 13 element according to the Periodic Table determined by IUPAC. The group 13 elements are specifically gallium, aluminum, indium, thallium, and the like. Further, examples of additives include carbon, a metal having a low melting point (tin, bismuth, silver, gold), and a metal having a high melting point (a transition metal such as iron, manganese, titanium, chromium etc.). The metal having a low melting point may be added for preventing oxidation of sodium, and the metal having a high melting point may be incorporated from a container for containing a crucible, a heater of a growing furnace or the like.

The light emitting element structure includes, for example, an n-type semiconductor layer, a light emission region provided over the n-type semiconductor layer, and a p-type semiconductor layer provided over the light emission region. In the light emitting element 5A shown in FIG. 2(b), a n-type contact layer 6a, an n-type clad layer 6b, an active layer 6c, a p-type clad layer 6d, and a p-type contact layer 6e are formed over the gallium nitride crystal layer 3, thereby producing a light emitting element structure 6A.

The light emitting element structure can be further provided with an n-type semiconductor layer electrode, a p-type semiconductor layer electrode, a conductive adhesive layer, a buffer layer, a conductive supporting body (these elements not being shown), and the like.

In the light emitting element structure, when the light emission region generates light by recombination between electrons and holes implanted from the semiconductor layer, the light is taken out of the side of the translucent electrode or a nitride single crystal film of a group 13 element on the p-type semiconductor layer. The translucent electrode means a light permeable electrode composed of a metal thin film or a transparent conductive film formed on the substantially entire surface of the p-type semiconductor layer.

Semiconductor materials for the n-type semiconductor layer and the p-type semiconductor layer are group III-V based compound semiconductors, and can be exemplified as follows:

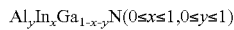

Examples of dopants for imparting n-type conductivity include silicon, germanium and oxygen by way of example. Further, examples of the dopants for imparting p-type conductivity include magnesium and zinc by way of example.

The surface of a film of a nitride of a group 13 element provided with the light emission structure may be a flat surface. However, as disclosed in Japanese Unexamined Patent Application Publication No. 2006-332714A, pits and projections may be provided on the surface of the film of the nitride of the group 13 element, thereby changing an optical waveguide direction in the semiconductor layer to enhance an external quantum efficiency.

Preferable examples of the materials for the electrodes include an alloy or a multilayer film containing at least one kind of element selected from the group consisting of Ni, Pd, Co, Fe, Ti, Cu, Rh, Au, Ru, W, Zr, Mo, Ta, Pt, Ag and an oxide and a nitride thereof. These materials can obtain good ohmic contact with the p-type semiconductor layer by being annealed at a temperature of 400° C. or higher. In particular, the electrode is preferably a multilayer film including a film of Au stacked on a film of Ni. The total thickness of the electrode is preferably in a range of 50 Å to 10000 Å. Especially, in use of the translucent electrode, the thickness of the electrode is preferably in a range of 50 Å to 400 Å. In the case of the non-translucent electrode, the thickness of the electrode is preferably in a range of 1000 Å to 5000 Å.

A release layer may be formed between the n-type semiconductor layer and the film of the nitride of the group 13 element. Examples of materials for the release layer include a low-temperature GaN buffer layer, ZnO, and TiN.

Various vapor phase epitaxial growth methods may be used as growth methods of the respective semiconductor layers included in the light emission structure. For example, the metal organic chemical vapor deposition method (MOCVD (or MOVPE) method), molecular beam epitaxy method (MBE method), hydride vapor phase epitaxy method (HVPE method), etc., may be used. Among them, especially, the MOCVD method can quickly obtain the semiconductor layer having excellent crystallinity. In the MOCVD method, an alkyl metal compound, such as trimethylgallium (TMG) and triethylgallium (TEG), is used as a Ga source, and gas, such as ammonia and hydrazine, is used as a nitrogen source.

The light emission region includes a quantum well active layer. Material for the quantum well active layer is designed to have a bandgap smaller than those of materials for the n-type semiconductor layer and the p-type semiconductor layer. The quantum well active layer may have a single quantum well (SQW) structure or a multiple quantum well (MQW) structure. Materials for the quantum well active layer may be exemplified as follows.

In a preferred example of the quantum well active layer, a MQW structure can be exemplified in which AlxGa1-xN/AlyGa1-yN-based quantum well active layer (x=0.15, y=0.20) of 3 nm/8 nm in thickness, respectively, is formed in 3 to 5 cycles.

As the conductive adhesive, for example, an Au/Ge-based solder can be used in a thickness of approximately 0.5 to 100 μm. The light emission structure can be bonded to another conductive supporting body via the conductive adhesive. The conductive supporting body serves to support the light emission structure and also has a current injection function into the p-type semiconductor layer. Suitable materials for the conductive supporting body includes GaAs, SiC, Si, Ge, C, Cu, Al, Mo, Ti, Ni, W, Ta, CuW, Au/Ni, and the like.

(Applications)

The invention may be applied to the technical fields requiring high quality, for example, a blue LED with a high color rendering property, which is called "post-fluorescent lights", and a blue-violet laser for a high-speed and high-density optical memory, a power device used in an inverter for hybrid vehicles, and the like.

EXAMPLES

Example 1

Production of Seed Crystal Substrate

By the MOCVD method, a low-temperature GaN buffer layer of 40 nm in thickness was deposited at 530° C. on a c-plane sapphire body of 2 inches in diameter and of 500 μm in thickness, and then a GaN film of 3 μm in thickness was stacked on the buffer layer at 1050° C. The warpage of the substrate was measured after cooling the substrate down to room temperature by natural cooling. The substrate was formed to have a convex shape with a GaN deposited surface facing upward. A warpage of a 2-inch wafer, which is defined as a difference between the highest height and the lowest height at the flat surface, was +20 μm. A defect density observed with a TEM was $1\times10^9/cm^2$. The substrate was ultrasonically cleaned with an organic solvent and ultrapure water, respectively, for 10 minutes, and then dried to form a seed crystal substrate.

(GaN Crystal Growth by Liquid Phase Method)

Then, gallium nitride was grown on the upper surface of the seed crystal substrate by the flux method.

Metal gallium (Ga) and metallic sodium (Na) were measured to have a molar ratio of 20:80 by use of an alumina crucible, and these metals were put on the bottom of the crucible, together with the seed crystal substrate.

In this example, gallium nitride crystal was grown for 20 hours as a growth time to have a thickness of 180 μm. When the substrate was disposed with the sapphire facing downward, the warpage of the substrate took a convex shape. The warpage of a 2-inch wafer, which is defined as a difference between the highest height and the lowest height at the flat surface, was +250 μm.

This gallium nitride crystal did not emit yellow light in measurement with a fluorescent microscope. In some cases, this gallium nitride crystal emitted pale light in measurement with the fluorescent microscope. The origin of this light emission was not clear yet, but considered to be due to the manufacturing method itself. In PL spectrum measurement, the emission wavelength of the gallium nitride crystal was found to have a broad spectrum from 430 nm to 500 nm.

(Production of Composite Substrate)

The grown gallium nitride crystal was polished and processed in the following steps.

After grinding with a grind stone of the solid abrasive grains to shape a surface of the gallium nitride crystal, polishing (lapping) was performed on the surface using free abrasive grains, such as diamond slurry. Then, the surface of the gallium nitride crystal was precisely polished using acidic or alkaline CMP slurry.

From the viewpoint of the invention, the thickness of the gallium nitride crystal obtained after the polishing process was made 15 μm. When a wafer was disposed with the sapphire facing downward, the warpage of the wafer polished took a convex shape. The warpage of the 2-inch wafer, which is defined as a difference between the highest height and the lowest height at the flat surface, was +120 μm at room temperature.

Then, the thus polished gallium nitride was protected by a protective film, and the sapphire body was bonded to a polishing surface plate with the gallium nitride facing downward. The sapphire body was polished and processed to introduce processing strains into the sapphire body in the following steps.

After grinding with the grind stone of the solid abrasive grains to shape a surface of the substrate, polishing (lapping) was performed on the substrate using free abrasive grains having an average grain size of 1 to 10 μm, such as diamond slurry. Then, the substrate was polished using acidic or alkaline CMP slurry containing colloidal silica abrasive grains to have its surface converted into a half-mirror surface.

This substrate was subjected to scrubbing cleaning (by scrubbing with a brush), and then to ultrasonic cleaning with ultrapure water to be dried, thereby producing a substrate for deposition of an LED structure.

The polished composite substrate obtained in this way had a thickness of 450 μm from the viewpoint of the invention. The warpage of the wafer obtained after polishing the sapphire was +80 μm at room temperature similarly to the above, which was smaller by 40 μm than that of the wafer before polishing the sapphire.

By a cathode luminescence system, a density of dark spots on the gallium nitride film formed on the surface of the composite substrate by the liquid phase method was approximately $1\times10^7/cm^2$.

(Deposition of LED Structure)

An LED structure was deposited by the MOCVD method in the following steps. Thermal cleaning was performed by heating the substrate from room temperature up to about 1050° C. for about 15 minutes under a mixed atmosphere including nitrogen, hydrogen, and ammonia, and then holding the temperature for 15 minutes. Then, an n-GaN layer of 2 μm in thickness was deposited on the substrate at 1050° C., and the temperature of the substrate with the GaN layer was decreased to 750° C., whereby 10 pairs of multiple quantum wells (active layers) composed of InGaN/GaN were deposited. Further, on the substrate, an electron block layer made of AlGaN was grown in a thickness of 0.02 μm, and then was heated to 1000° C., whereby p-GaN (p clad layer of 80 nm in thickness) and p+GaN (p contact layer of 20 nm in thickness) were deposited thereon and allowed to cool down to the room temperature.

The wafer was taken out of an MOCVD furnace and observed visually, resulting in no crack observed. When observing the wafer with a differential interference microscope, its surface was confirmed to be flat.

Using the wafer, an LED element of about 0.3 mm square was fabricated by a conventional photolithography process. When applying a voltage of about 3.5 V to the electrode, it was observed that the LED element emitted blue light having a wavelength of about 460 nm. The in-plane distribution of the emission wavelength in the LED element was measured to be in a range of 460±5 nm. The area of about 70% of the wafer was restricted to have the emission wavelength in a range of 460±2.5 nm.

Example 2

The same experiment as in Example 1 was performed except that the thickness of the gallium nitride crystal obtained after the polishing process was set to 10 μm. The composite substrate had both surfaces on the gallium nitride side and the sapphire side polished to have a thickness of 445 μm. The warpage of the composite substrate had a convex shape similarly to the above, and the warpage was +40 μm at room temperature.

In the same way as Example 1, the LED structure was deposited. The in-plane distribution of the emission wavelength in the LED structure was measured to be in a range of 460±5 nm. The area of about 70% of the wafer was restricted to have the emission wavelength in a range of 460±2.5 nm.

Example 3

The same experiment as in Example 1 was performed except that the thickness of the gallium nitride crystal obtained after the polishing process was set to 13 μm. The composite substrate had both surfaces on the gallium nitride side and the sapphire side polished to have a thickness of 448

µm. The warpage of the composite substrate had a convex shape similarly to the above, and the warpage was +70 µm at room temperature.

In the same way as Example 1, the LED structure was deposited. The in-plane distribution of the emission wavelength in the LED structure was measured to be in a range of 460±5 nm. The area of about 80% of the wafer was restricted to have the emission wavelength in a range of 460±2.5 nm.

Example 4

The same experiment as in Example 1 was performed, except that the polishing step using the acid or alkaline CMP slurry (colloidal silica) is omitted after the lapping of the sapphire surface with the diamond slurry. The diamond slurries were used in two stages, specifically, diamond slurry having an average grain size of 10 µm was used, and then a diamond slurry having an average grain size of 2 µm was used. As a result, like Example 1, the sapphire surface was half-mirror surface. The thickness of the gallium nitride crystal obtained after the polishing process was 15 µm.

The composite substrate had both surfaces on the gallium nitride side and the sapphire side polished to have a thickness of 450 µm. The warpage of the composite substrate had a convex shape similarly to the above, and the warpage was +50 µm at room temperature. In the same way as Example 1, the LED structure was deposited. The in-plane distribution of the emission wavelength in the LED structure was measured to be in a range of 460±5 nm. The area of about 80% of the wafer was restricted to have the emission wavelength in a range of 460±2.5 nm.

Example 5

In the same way as Example 1, the composite substrate was fabricated. Thereafter, a $SiO_2$ film was deposited at the bottom surface 1c of the composite substrate by plasma CVD. The thickness of the $SiO_2$ film was 5 µm. That is, the thickness of the composite substrate was 455 µm. The warpage of the composite substrate at room temperature had a convex shape similarly to the above, and the warpage was +40 µm, which was smaller by 40 µm than that of the wafer before depositing the $SiO_2$ film.

In the same way as Example 1, the LED structure was deposited on the composite substrate. The in-plane distribution of the emission wavelength in the LED structure was measured to be in a range of 460±5 nm. The area of about 90% of the wafer was restricted to have the emission wavelength in a range of 460±2.5 nm. That is, the in-plane uniformity of this example was slightly improved as compared to Example 1.

Example 6

The same experiment as in Example 5 was performed, except that the thickness of the gallium nitride crystal obtained after the polishing process was 25 µm and the thickness of a $SiO_2$ film over the bottom surface 1c of the composite substrate was 10 µm. That is, the thickness of the composite substrate was 470 µm. The warpage of the composite substrate at room temperature had a convex shape similarly to the above, and the warpage was +80 µm, which was smaller by 80 µm than that of the wafer before depositing the $SiO_2$ film.

By the cathode luminescence device, a density of dark spots on the gallium nitride film formed on the surface of the composite substrate by the liquid phase method was measured to be approximately $8 \times 10^6/cm^2$, which means that the density of dislocations in this example was smaller than that in Example 1.

In the same way as Example 1, the LED structure was deposited on the composite substrate. The in-plane distribution of the emission wavelength in the LED structure was measured to be in a range of 460±5 nm. The area of about 80% of the wafer was restricted to have the emission wavelength in a range of 460±2.5 nm. A chip of 1 mm square was cut out from the composite substrate and driven with a current of 1 A, resulting in a high internal quantum efficiency of 80%. The current density at this time was 100 A/cm². That is, in this example, the LED was able to be driven with a larger current at a higher current density than those in Example 1.

Comparative Example 1

The same experiment as in Example 1 was performed, except that the average grain size of a diamond slurry was different from that in Example 1. After grinding with the grind stone of the solid abrasive grains to shape a surface of the sapphire, polishing (lapping) was performed on the surface using free abrasive grains such as diamond slurry having an average grain size of 15 µm. Thereafter, the substrate was polished using an acidic or alkaline CMP slurry (colloidal silica) to have its surface converted into a half-mirror surface. Here, the thickness of the gallium nitride crystal obtained after the polishing process was 10 µm.

Both surfaces of the composite substrate on the gallium nitride side and the sapphire side were polished in this way to have a thickness of 445 µm. The warpage of the composite substrate had a convex shape similarly to the above, and the warpage was +30 µm at room temperature.

The LED structure was deposited in the same way as in Example 1. The in-plane distribution of the emission wavelength in the LED structure was measured to be within a range of 460±10 nm, which was twice as large as that in Example 1. The ratio of the area having the emission wavelength distribution in a range of 460±2.5 nm to the total LED structure was about 40%, which was narrow.

Comparative Example 2

The same experiment as in Example 1 was performed, except that a sapphire surface was formed as a mirror surface using an acidic or alkaline CMP slurry (colloidal silica). The thickness of the gallium nitride crystal obtained after the polishing process was 15 µm. The composite substrate had both surfaces on the gallium nitride side and the sapphire side polished to have a thickness of 450 µm. The warpage of the composite substrate had a convex shape similarly to the above, and the warpage was +100 µm at room temperature.

The LED structure was deposited in the same way as in Example 1. The in-plane distribution of the emission wavelength in the LED structure was measured to be within a range of 460-18 nm, which was twice as large as that in Example 1. The ratio of the area having the emission wavelength distribution in a range of 460±2.5 nm to the total LED structure was about 50%, which was narrow.

The invention claimed is:
1. A composite substrate comprising:
a sapphire body; and
a gallium nitride crystal layer disposed over said sapphire body,
wherein a warpage of said composite substrate is in a range of not less than +40 µm and not more than +80 µm per 5.08 cm in length.

2. The composite substrate of claim 1, wherein a surface of said gallium nitride crystal layer is a mirror surface, and wherein a bottom surface of said sapphire body is a half-mirror surface.

3. The composite substrate of claim 1, wherein said composite substrate has a shape of a disk, and wherein said composite substrate has a size of 50 mm or more in diameter $\phi$.

4. The composite substrate of claim 1, further comprising a film formed on a bottom surface of said sapphire body and comprising a heat resistant material.

5. The composite substrate of claim 1, wherein said gallium nitride crystal layer is grown from a melt by a flux method under a nitrogen containing atmosphere.

6. A functional device, comprising:
  said composite substrate of claim 1; and
  a functional layer formed over said gallium nitride crystal layer by a vapor phase method, said functional layer comprising a nitride of a group 13 element.

7. The functional device of claim 6, wherein said functional layer has a function of emitting a light.

* * * * *